(12) United States Patent
Wu et al.

(10) Patent No.: US 11,258,011 B2
(45) Date of Patent: Feb. 22, 2022

(54) RESISTIVE RANDOM ACCESS MEMORY STRUCTURE AND MANUFACTURING METHOD THEREOF

(71) Applicant: Winbond Electronics Corp., Taichung (TW)

(72) Inventors: Bo-Lun Wu, Tianzhong Township, Changhua County (TW); Po-Yen Hsu, New Taipei (TW); Ting-Ying Shen, Chiayi (TW); Meng-Hung Lin, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 8 days.

(21) Appl. No.: 16/913,496

(22) Filed: Jun. 26, 2020

(65) Prior Publication Data
US 2021/0005812 A1  Jan. 7, 2021

(30) Foreign Application Priority Data
Jul. 1, 2019  (TW) .................................. 108123070

(51) Int. Cl.
*H01L 45/00* (2006.01)
*H01L 27/24* (2006.01)
(52) U.S. Cl.
CPC ........ *H01L 45/165* (2013.01); *H01L 27/2463* (2013.01); *H01L 45/08* (2013.01);
(Continued)

(58) Field of Classification Search
CPC ............. H01L 27/24–249; H01L 45/00; H01L 45/04–1691
See application file for complete search history.

(56) References Cited

U.S. PATENT DOCUMENTS 8,465,996 B2 * 6/2013 Miller ................. H01L 45/1608
438/45
8,787,066 B2 * 7/2014 Wang .................... H01L 45/065
365/148

(Continued)

FOREIGN PATENT DOCUMENTS

WO   WO-2016/111724 A1   7/2016

*Primary Examiner* — Andres Munoz
(74) *Attorney, Agent, or Firm* — Muncy, Geissler, Olds & Lowe, P.C.

(57) ABSTRACT

An RRAM structure and its manufacturing method are provided. The RRAM structure includes a bottom electrode layer, a resistance switching layer, and an implantation control layer sequentially formed on a substrate. The resistance switching layer includes a conductive filament confined region and an outer region surrounding the conductive filament confined region. The RRAM structure includes a protective layer and a top electrode layer. The protective layer conformally covers the bottom electrode layer, the resistance switching layer, and the implantation control layer and has a first opening. The top electrode layer is located on the implantation control layer, and a portion of the top electrode layer is filled into the first opening. The position of the top electrode layer corresponds to that of the conductive filament confined region, and the top surface of the top electrode layer is higher than that of the protective layer.

20 Claims, 5 Drawing Sheets

(52) U.S. Cl.
CPC ........ *H01L 45/1253* (2013.01); *H01L 45/146* (2013.01); *H01L 45/1658* (2013.01); *H01L 45/1233* (2013.01)

(56) References Cited

U.S. PATENT DOCUMENTS

| | | |
|---|---|---|
| 9,960,350 B2 | 5/2018 | Ha |
| 2010/0163819 A1* | 7/2010 | Hwang ................ H01L 45/146 257/2 |
| 2010/0243983 A1 | 9/2010 | Chiang et al. |
| 2012/0295398 A1* | 11/2012 | Kurunczi ............. H01L 45/165 438/104 |
| 2016/0268506 A1* | 9/2016 | Huang ................... H01L 45/16 |

* cited by examiner

RESISTIVE RANDOM ACCESS MEMORY STRUCTURE AND MANUFACTURING METHOD THEREOF

CROSS REFERENCE TO RELATED APPLICATIONS

This Application claims priority of Taiwan Patent Application No. 108123070, filed on Jul. 1, 2019, the entirety of which is incorporated by reference herein.

BACKGROUND

Field of the Disclosure

The present disclosure relates to a memory device, and in particular it relates to a resistive random access memory structure and a method for manufacturing the resistive random access memory structure.

Description of the Related Art

Resistive random access memory (RRAM) has several advantages, such as its simple structure, small area, low operating voltage, fast operating speed, long memory time, capability for multi-bit storage, and low power consumption. Hence, RRAM has great potential to replace the current flash memory for being the main non-volatile memory used in the next generation.

When a forming voltage or a writing voltage is applied to a RRAM structure, oxygen ions are driven by the voltage and move away from the resistance switching layer. The equivalent positive-charged oxygen vacancies remaining in the resistance switching layer form conductive filaments (or conductive paths), thereby switching the resistance switching layer from a high-resistance state to a low-resistance state. When an erasing voltage is applied, the oxygen ions return to the resistance switching layer and combine with the equivalent positive-charged oxygen vacancies. Therefore, the above-mentioned conductive filaments disappear, and the resistance switching layer is switched from a low-resistance state to a high-resistance state.

Conductive filaments are formed randomly during switching to the low-resistance state. Therefore, the position and size of the conductive filaments that are produced in the transitions are different and uncontrollable. In other words, it is difficult to control the electrical resistance value of the low-resistance state. As a result, the variability in the operating voltage is large and the stability of the device is poor, such that the yield and reliability of the final product are reduced.

Therefore, there is still a need to improve the RRAM and its manufacturing method.

BRIEF SUMMARY

The disclosure provides a RRAM structure and a manufacturing method thereof. By using this manufacturing method, the positions where the conductive filaments are formed can be precisely controlled. Therefore, the variability of the operating voltage and the stability of the device can be improved, thereby improving the yield and reliability of the final product.

The disclosure provides a RRAM structure. The RRAM structure includes a bottom electrode layer, a resistance switching layer, an implantation control layer sequentially formed on a substrate. The resistance switching layer includes a conductive filament confined region and an outer region surrounding the conductive filament confined region. The RRAM structure includes a protective layer and a top electrode layer. The protective layer conformally covers the bottom electrode layer, the resistance switching layer, and the implantation control layer and has a first opening. The top electrode layer is located on the implantation control layer, and a portion of the top electrode layer is filled into the first opening. The position of the top electrode layer corresponds to that of the conductive filament confined region, and the top surface of the top electrode layer is higher than that of the protective layer.

The disclosure provides a method for manufacturing a RRAM structure. The method includes forming a bottom electrode on a substrate, forming a resistance switching layer on the bottom electrode, and forming an implantation control layer on the resistance switching layer. The method also includes forming a protective layer conformally covering the bottom electrode layer, the resistance switching layer, and the implantation control layer, wherein the protective layer has a first opening. The method also includes performing an ion implantation process to form a conductive filament confined region and an outer region in the resistance switching layer. The outer region surrounds the conductive filament confined region. The method also includes forming a top electrode layer on the implantation control layer after forming the protective layer. The position of the top electrode layer corresponds to the position of the conductive filament confined region. A portion of the top electrode layer is filled into the first opening. The top surface of the top electrode layer is higher than the top surface of the protective layer.

In the RRAM structure provided by the embodiments of the present invention, most of the conductive filaments con be confined in a specific region (i.e., the conductive filament confined region). Therefore, the variability of the operating voltage and the stability of the device can be improved. Furthermore, in the manufacturing method of the RRAM structure provided by the present invention, the top electrode is formed by filling the conductive material into the opening located directly above the conductive filament confined region. Therefore, the undercut does not occur on the sidewall of the top electrode layer, and the yield and reliability of the final product can be further improved.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION

Figure 1A:
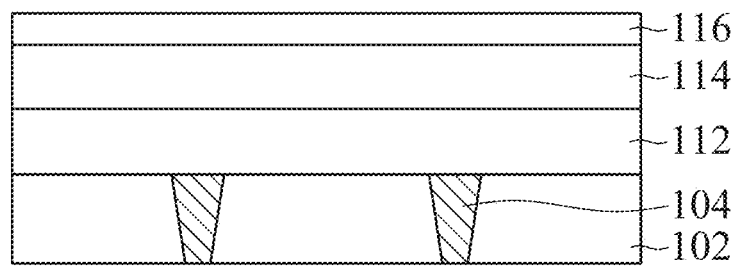
FIGS. 1A-1D show cross-sectional views of various stages of forming a RRAM structure in accordance with some embodiments of the present invention.

The present disclosure is best understood from the following detailed description when read with the accompanying figures. It should be noted that, in accordance with the standard practice in the industry, various features are not drawn to scale. In fact, the relative dimensions of the various features may be arbitrarily increased or reduced for clarity of discussion. In addition, the present disclosure may repeat reference numerals and/or letters in the various examples. This repetition is for the purpose of simplicity and clarity and does not in itself dictate a relationship between the various embodiments and/or configurations discussed.

FIGS. 1A-1D show cross-sectional views of various stages of forming a RRAM structure 100 in accordance with some embodiments of the present invention. Referring to FIG. 1A, a substrate 102 is provided. The material of the substrate 102 may include a bulk semiconductor substrate (for example, a silicon substrate), a compound semiconductor substrate (for example, a IIIA-VA group semiconductor substrate), a silicon on insulator (SOI) substrate, and so on. The substrate 102 may be a doped or an undoped semiconductor substrate. In some embodiments, the substrate 102 is a silicon substrate.

Then, contact plugs 104 are formed in substrate 102. In some embodiments, the contact plug 104 is a single layer structure made of conductive material including tungsten, aluminum, copper, another suitable metal, or a combination thereof. In some embodiments, the contact plug 104 is a dual-layer structure including a liner and a conductive layer. The liner can improve the adhesion between the conductive layer and the substrate 102, and can prevent metal atoms from diffusing into the substrate 102. The material of the liner may include titanium, titanium nitride, tungsten nitride, tantalum, tantalum nitride, another suitable conductive material, or a combination thereof. The conductive layer may be made of the above-mentioned conductive material.

Then, a bottom electrode layer 112 is formed on the substrate 102, and a resistance switching layer 114 is formed on the bottom electrode layer 112. The bottom electrode layer 112 and the resistance switching layer 114 may be independently formed by using a physical vapor deposition process, a chemical vapor deposition process, an atomic layer deposition process, or another suitable deposition process.

The bottom electrode layer 112 can be electrically connected to other elements (not shown) in the substrate by the contact plugs 104. The resistance switching layer 114 may be switched to a different electrical resistance state by applying a voltage to the bottom electrode layer 112 and the subsequently formed top electrode layer 134. The material of the bottom electrode layer 112 may include titanium, tantalum, titanium nitride, tantalum nitride, another suitable conductive material, or a combination thereof. The bottom electrode layer 112 may be a single layer structure formed of a single material or a multilayer structure formed of a plurality of different materials. In some embodiments, the bottom electrode layer 112 is a single layer structure formed of titanium. In other embodiments, the bottom electrode layer 112 is a dual-layer structure including a titanium nitride layer and a titanium layer formed thereon.

The material of the resistance switching layer 114 may include transition metal oxides, for example, aluminum oxide ($Al_2O_3$), titanium dioxide ($TiO_2$), hafnium dioxide ($HfO_2$), zirconium dioxide ($ZrO_2$), tantalum dioxide ($TaO_2$), tantalum oxide ($Ta_2O_5$), or another suitable transition metal oxide. The resistance switching layer 114 may be a single layer structure formed of a single material or a multilayer structure formed of a plurality of different materials. In some embodiments, the resistance switching layer 114 is a single layer structure formed of hafnium dioxide. In other embodiments, the resistance switching layer 114 is a dual-layer structure including a hafnium dioxide layer and an aluminum oxide layer formed thereon.

Afterwards, an implantation control layer 116 is formed on the resistance switching layer 114. The implantation control layer 116 may be formed by using a physical vapor deposition process, a chemical vapor deposition process, an atomic layer deposition process, or another suitable deposition process. In the subsequent process, the metal ions will be implanted into the resistance switching layer 114. However, these metal ions are easily moved in the resistance switching layer 114 along the interface of the crystal lattice. Therefore, it is difficult to control the depth of the implantation. When the implantation control layer 116 is formed on the resistance switching layer 114 before the implantation process, the implantation depth of the metal ions can be well controlled. The material of the implantation control layer 116 may be suitable oxide or oxynitride. In some embodiments, the material of the implantation control layer 116 includes silicon dioxide ($SiO_2$), silicon oxynitride (SiON), silicon nitride (SiN), titanium oxynitride (TiON), or a combination thereof.

If the implantation control layer 116 is sufficiently thick, the implantation depth of the metal ions can be well controlled. Thus, the reliability of the memory device can be improved. If the implantation control layer 116 is sufficiently thin, it can facilitate miniaturization of the memory device. In order to balance the reliability and size of the memory device, the implantation control layer 116 may be adjusted to a suitable range. In some embodiments, as shown in FIG. 1D, the ratio T2/T1 of the thickness T2 of the implantation control layer 116 to the thickness T1 of the resistance switching layer 114 is 0.1-0.8. In other embodiments, the ratio T2/T1 of the thickness T2 of the implantation control layer 116 to the thickness T1 of the resistance switching layer 114 is 0.3-0.5.

Figure 1B:
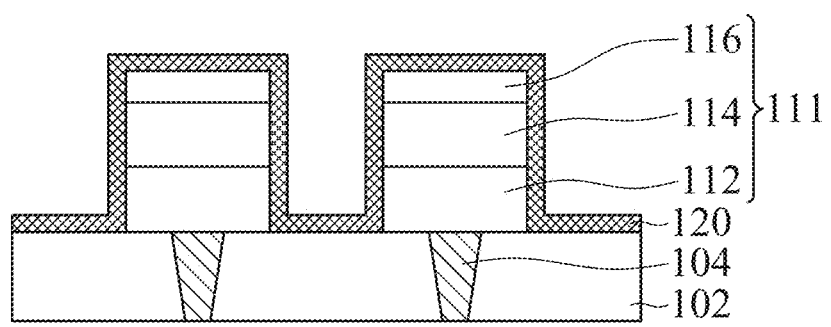

Referring to FIG. 1B, a patterning process is performed to form a plurality of stacked structures 111 which is formed by the bottom electrode layer 112, the resistance switching layer 114, and the implantation control layer 116. The position of the stacked structure 111 corresponds to the position of the contact plug 104. In the present embodiment, each of the stacked structures 111 is located directly above one of the contact plugs 104.

Then, a protective layer 120 is formed to conformally cover the stacked structures 111. The protective layer 120 may be formed by using a physical vapor deposition process, a chemical vapor deposition process, an atomic layer deposition process, or another suitable deposition process. The protective layer 120 may be a single layer structure formed of a single material or a multilayer structure formed of a plurality of different materials. In some embodiments, the protective layer 120 is a dual-layer structure formed by a hydrogen barrier layer and a spacer layer formed on the hydrogen barrier layer. In such an embodiment, the hydrogen barrier layer can prevent hydrogen from entering the substrate 102, thereby avoiding degradation or failure of the RRAM structure. The material of the hydrogen barrier layer may be a metal oxide (such as, aluminum oxide), a metal nitride, a metal oxynitride, or a combination thereof. The spacer layer can reduce or avoid the damage to the stacked structure 111 during subsequent processes. The material of the spacer layer may be an oxide, a nitride or an oxynitride. In other embodiments, the function and material of the protective layer 120 may be the same or similar to the function and material of the spacer layer. In some embodiments, the material of the protective layer 120 includes aluminum oxide, aluminum nitride (AlN), silicon oxynitride, silicon nitride, or a combination thereof, and the material of the protective layer 120 is different from the material of the implantation control layer 116. In the present embodiment, the protective layer 120 is a single layer structure formed of aluminum oxide.

If the protective layer 120 is sufficiently thick, damage can be effectively reduced or avoided. Thus, the yield of the memory device can be improved. If the protective layer 120 is sufficiently thin, it can facilitate miniaturization of the memory device. In order to balance the yield and size of the memory device, the thickness of the protective layer 120 may be adjusted to a suitable range. When the protective layer 120 is a multilayer structure, the term "the thickness of the protective layer 120" means the total thickness of all the material layers of the protective layer 120. In some embodiments, the thickness of the protective layer 120 is 2-40 nm.

Figure 1C:
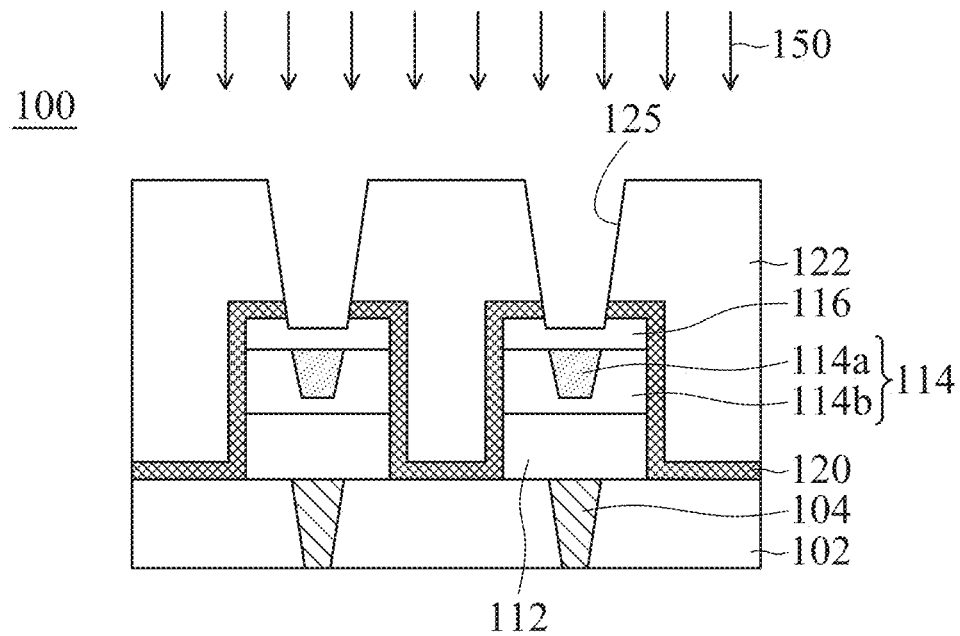
Figure 1D:
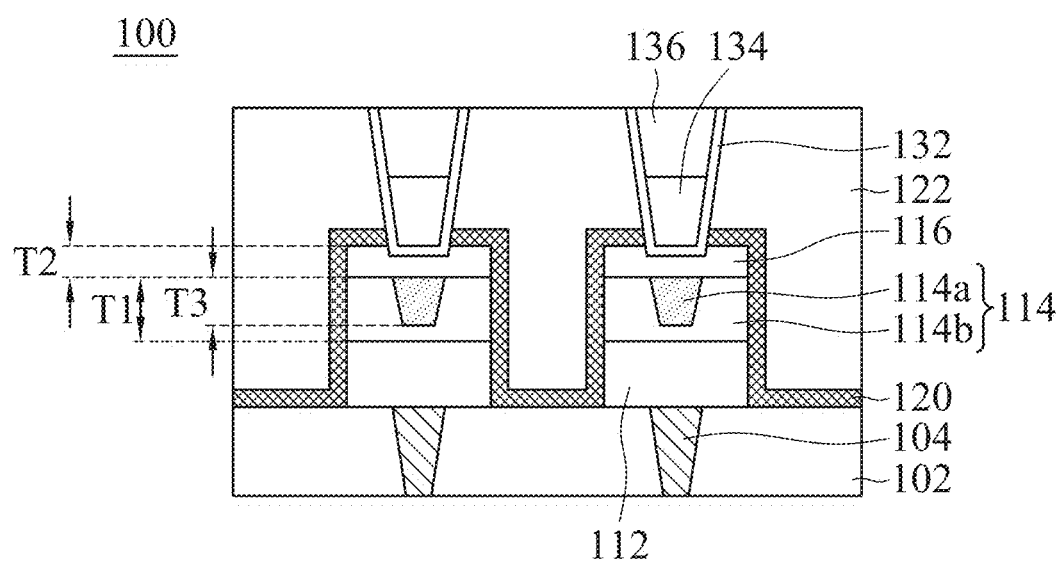

Referring to FIG. 1C, an interlayer dielectric layer 122 is formed on the protective layer 120. The interlayer dielectric layer 122 covers the protective layer 120 and the stacked structure 111 and fills the gap between the adjacent stacked structures 111. Then, a planarization process (for example, a chemical mechanical polishing process) is performed to make the interlayer dielectric layer 122 have a flat top surface. In some embodiments, the material of the interlayer dielectric layer 122 is an oxide and is formed by a chemical vapor deposition process.

Then, an etching process is performed by using a patterned mask (not shown) to remove a portion of the interlayer dielectric layer 122 and the protective layer 120, thereby forming a plurality of openings 125 in the interlayer dielectric layer 122 and the protective layer 120. In other words, the opening in the interlayer dielectric layer 122 and the opening in the protective layer 120 are connected to form the opening 125. The etching process can be a dry etching or another suitable anisotropic etching process. The position of the opening 125 corresponds to the position of the stacked structure 111. In the present embodiment, each opening 125 is located directly above one of the stacked structures 111. In the present embodiment, the implantation control layer 116 exposed by the opening 125. The thickness of the implantation control layer 116 is reduced at the position corresponding to the position of opening 125.

Then, an ion implantation process 150 is performed by using metal ions as dopants to form the conductive filament confined region 114a and the outer region 114b in the resistance switching layer 114, and the outer region 114b surrounds the conductive filament confined region 114a. The implantation control layer 116 is exposed by the opening 125, such that the position of the conductive filament confinement region 114a corresponds to the position of the opening 125.

By performing the ion implantation process 150, defects will be generated in the specific region of the resistance switching layer 114 (i.e., the conductive filament confined region 114a), thereby increasing the mobility of oxygen ions in this region. Therefore, when the resistance switching layer 114 is switched to a low-resistance state, compared to the outer region 114b, the conductive filaments will be more easily formed in the conductive filament confined region 114a. Furthermore, because the metal ions are used as the dopant in the ion implantation process 150, the conductivity of the specific region of the resistance switching layer 114 (i.e., the conductive filament confined region 114a) can be increased. In other words, when a voltage is applied, the current density of the conductive filament confined region 114a is higher than the current density of the outer region 114b. Therefore, when the resistance switching layer 114 is switched to a low-resistance state, compared to the outer region 114b, the conductive filaments will be more easily formed in the conductive filament confined region 114a. In this way, most of the conductive filaments can be formed in the conductive filament confined region 114a. In other words, it improves the variability and stability of the operating voltage and greatly improves the yield and reliability of the final product.

The dopant used in the ion implantation process 150 may include aluminum ions, zirconium ions, titanium ions, zinc ions, silver ions, manganese ions, molybdenum ions, tantalum ions, or a combination thereof. The dopants can be concentrated in the conductive filament confined region 114a by adjusting the process parameters of the ion implantation process 150. By adjusting the implantation angle, the depth of the implantation can be controlled more precisely, and the channeling effect in the ion implantation can be avoided. In some embodiments, the implantation energy of the ion implantation process 150 is 0.05-20 keV, the implantation dose of the dopant is $10^{11}$-$10^{15}$ ion/cm$^2$, and the implantation angle is 0-20 degrees.

If the implantation depth of the dopant is sufficiently deep, it helps to form the conductive filament confined region 114a, thereby improving the yield and reliability of the memory device. If the implantation depth of the dopant is sufficiently shallow, undesired diffusion of the dopant can be avoided. In order to well control the position and size of the conductive filament confined region 114a, the implantation depth of the dopant can be adjusted to a suitable range. In some embodiments, as shown in FIG. 1D, the ratio T3/T1 of the implantation depth T3 of the dopant to the thickness T1 of the resistance switching layer 114 is 0.1-0.8. In other embodiments, the ratio T3/T1 of the implantation depth T3 of the dopant to the thickness T1 of the resistance switching layer 114 is 0.3-0.5.

In some embodiments, after the ion implantation process 150 is performed, an annealing process may be optionally performed to moderately increase the width and depth of the conductive filament confined region 114a. By the annealing process after the implantation, the shape of the conductive filament can be controlled, and the switching of the electrical resistance state can be well controlled. After the annealing process, the dopant concentration in the conductive filament confined region 114a exhibits a gradient distribution from the top to the bottom. In other words, the dopant concentration is highest at the depth or the position which is close to the implantation control layer 116, and the dopant concentration gradually decreases as it approaches the bottom electrode layer 112. However, during the annealing process, a portion of the dopants will diffuse into the outer region 114b. In order to fully exert the function of the conductive filament confined region 114a, the ratio of the dopant concentration of the conductive filament confined region 114a to the dopant concentration of the outer region 114b can be adjusted to a suitable range. In some embodiments, after performing the annealing process, the dopant in the conductive filament confined region 114a has a first concentration C1, the dopant in the outer region 114b has a second concentration C2, and the ratio C1/C2 of the first concentration C1 to the second concentration C2 is 5-100.

Referring to FIG. 1D, in the present embodiment, a conductive liner 132 is conformally formed in the opening 125. Then, a first conductive material is filled in the opening 125 to form a top electrode layer 134 on the implantation control layer 116. Then, a second conductive material is filled in the opening 125 to form a contact plug 136 on the top electrode layer 134. The top surface of the contact plug 136 is coplanar with the top surface of the interlayer dielectric layer 122. The position of the top electrode layer 134 corresponds to the position of the conductive filament confined region 114a. In the present embodiment, each of the top electrode layers 134 is located directly above one of the conductive filament confined regions 114a. In the present embodiment, the etching process is not performed to the sidewall of the top electrode layer 134. Therefore, the sidewall of the top electrode layer will not undercut, such that the yield and reliability of the final product can be further improved.

The conductive liner 132 can prevent the second conductive material from diffusing into the interlayer dielectric layer 122. The material of the conductive liner 132 may include titanium, titanium nitride, tungsten nitride, tantalum, tantalum nitride, another suitable conductive material, or a combination thereof. The first conductive material used to form the top electrode layer 134 may include titanium, tantalum, titanium nitride, tantalum nitride, another suitable conductive material, or a combination thereof. The top electrode layer 134 can be electrically connected to other elements by the contact plug 136. The second conductive material used to form the contact plug 136 may include tungsten, aluminum, copper, another suitable metal, or a combination thereof. In some embodiments, the materials of the conductive liner 132, the top electrode layer 134, and the contact plug 136 are different from one another. In other embodiments, the conductive liner 132 may not be formed, and the top electrode layer 134 and the contact plug 136 may be directly formed in the opening 125.

Then, a planarization process (for example, a chemical mechanical polishing process) is performed to remove excess conductive liner 132, first conductive material, and second conductive material on interlayer dielectric layer 122. Thereafter, other conventional processes can be performed to complete the RRAM structure 100. These conventional processes will not be described in detail herein.

In some embodiments, a RRAM structure 100 is provided. Referring to FIG. 1D, the RRAM structure 100 includes the bottom electrode layer 112, the resistance switching layer 114, and the implantation control layer 116 sequentially formed on the substrate 102. The resistance switching layer 114 includes the conductive filament confined region 114a and the outer region 114b, and the outer region 114b surrounds the conductive filament confined region 114a. The RRAM structure 100 also includes the protective layer 120 conformally covering the bottom electrode layer 114, the resistance switching layer 114, and the implantation control layer 116. The protective layer 120 has an opening at the position corresponding to the conductive filament confined region 114a. The RRAM structure 100 also includes the top electrode layer 134 on the implantation control layer 116. The position of the top electrode layer 134 corresponds to the position of the conductive filament confined region 114a. A portion of the top electrode layer 134 is filled in the opening of the protective layer 120, and the top surface of the top electrode layer 134 is higher than the top surface of the protective layer 120.

In the present embodiment, the resistance switching layer 114 includes the conductive filament confined region 114a having a higher dopant concentration, and the position of the conductive filament confined region 114a is directly below the top electrode layer 134. When the electrical resistance state is switched to a low-resistance state, most of the conductive filaments may be formed in the conductive filament confined region 114a. Therefore, it can improve the variability of operating voltage and device stability, and greatly improve the yield and reliability of the final product.

FIGS. 2A-2D show cross-sectional views of various stages of forming a RRAM structure 200 in accordance with other embodiments of the present invention. In FIGS. 2A-2D, the elements that are the same as those shown in FIGS. 1A to 1D are denoted by the same reference numerals. In order to simplify the description, the elements that are similar to those shown in FIGS. 1A-1D and the steps in the process of forming them will not be described in detail herein.

Figure 2A:
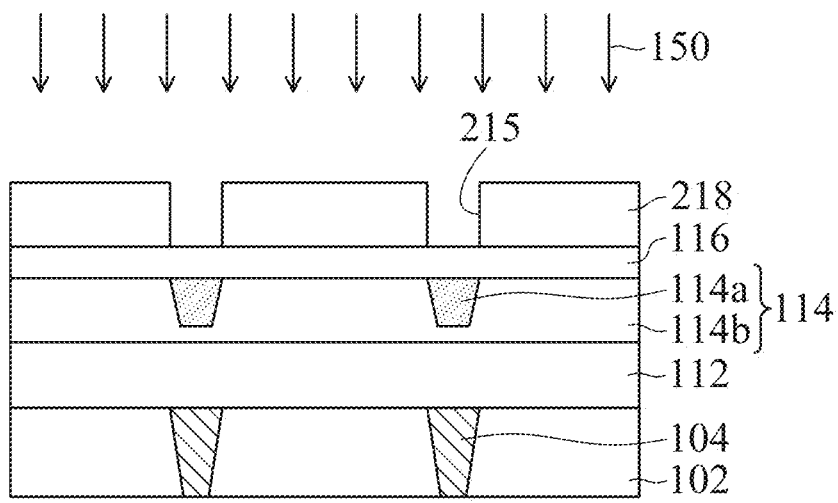
FIGS. 2A-2D show cross-sectional views of various stages of forming a RRAM structure in accordance with other embodiments of the present invention.

Referring to FIG. 2A, the bottom electrode layer 112, the resistance switching layer 114, and the implantation control layer 116 are sequentially formed on the substrate 102. Thereafter, a patterned photoresist layer 218 is formed on the implantation control layer 116. The patterned photoresist layer 218 has a plurality of openings 215. The position of each opening 215 corresponds to the position of one of the contact plugs 104.

Then, an ion implantation process 150 is performed by using metal ions to form the conductive filament confined region 114a and the outer region 114b in the resistance switching layer 114. Because the opening 215 exposes the implantation control layer 116, the position of the conductive filament confined region 114a corresponds to the position of the opening 215. In some embodiments, after the ion implantation process 150 is performed, an annealing process may be optionally performed to moderately increase the width and depth of the conductive filament confined region 114a.

Figure 2B:
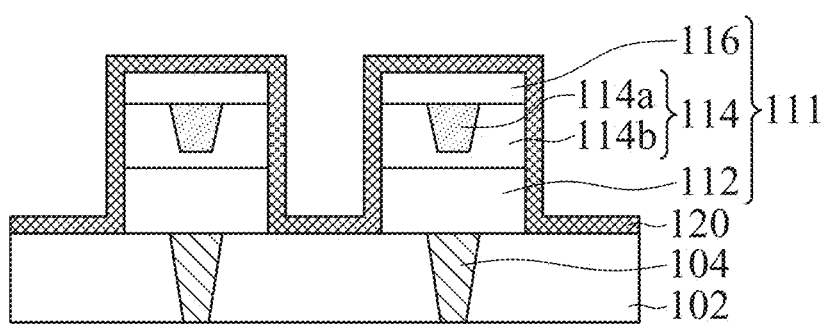

A patterning process is performed to form a plurality of stacked structures 111 which is formed by the bottom electrode layer 112, the resistance switching layer 114, and the implantation control layer 116, as shown in FIG. 2B. The position of the stacked structure 111 corresponds to the position of the contact plug 104. Then, the protective layer 120 is formed to conformally cover the bottom electrode layer 112, the resistance switching layer 114, and the implantation control layer 116.

Figure 2C:
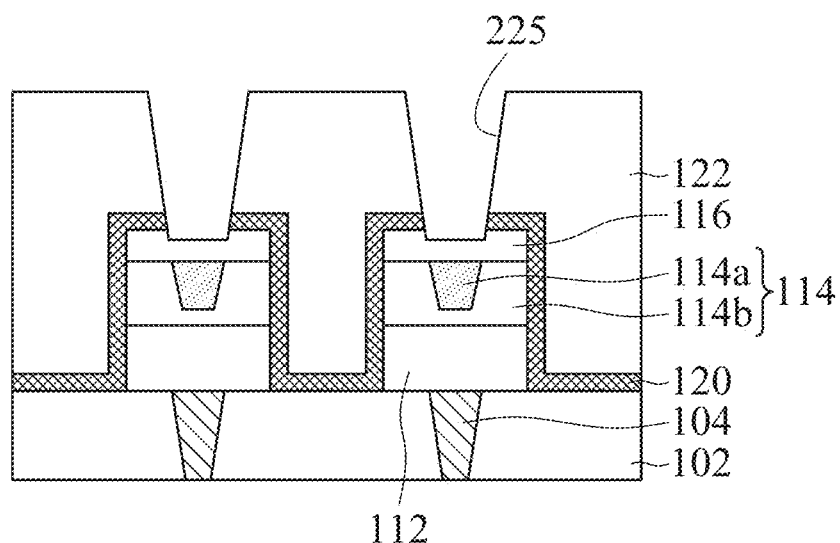

Referring to FIG. 2C, the interlayer dielectric layer 122 is formed on the protective layer 120. The interlayer dielectric layer 122 covers the protective layer 120 and the stacked structure 111, and it fills the gap between the adjacent stacked structures 111. Then, a planarization process is performed to make the interlayer dielectric layer 122 have a flat top surface. Then, an etching process is performed by using a patterned mask (not shown) to form a plurality of openings 225 in the interlayer dielectric layer 122 and the protective layer 120. In other words, the opening in the interlayer dielectric layer 122 is connected to the opening in the protective layer 120 to form the opening 225. The position of the opening 225 corresponds to the position of the conductive filament confined region 114a. In the present embodiment, the etching depth exceeds the protective layer 120, such that the implantation control layer 116 is exposed by the opening 225. After the structure shown in FIG. 2C is formed, the steps of the process described in FIG. 1D may be continued to complete the RRAM structure 200 shown in FIG. 2D.

Figure 2D:
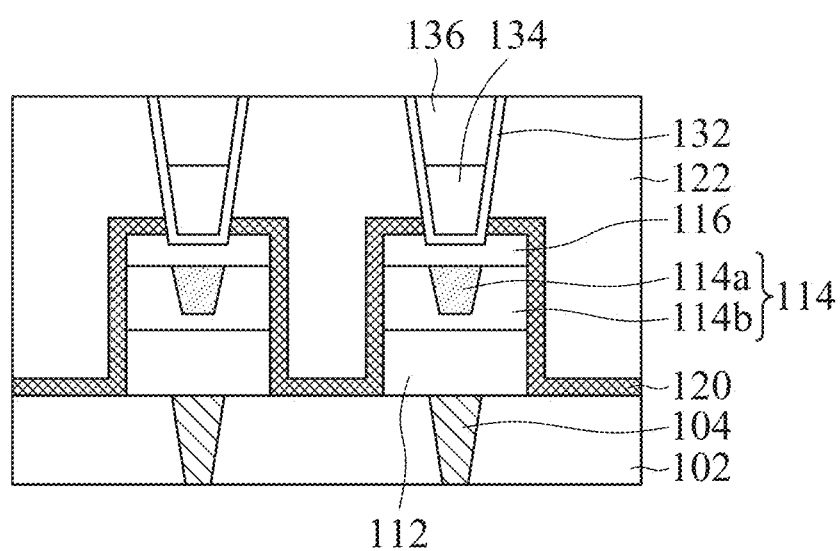
Figure 3:
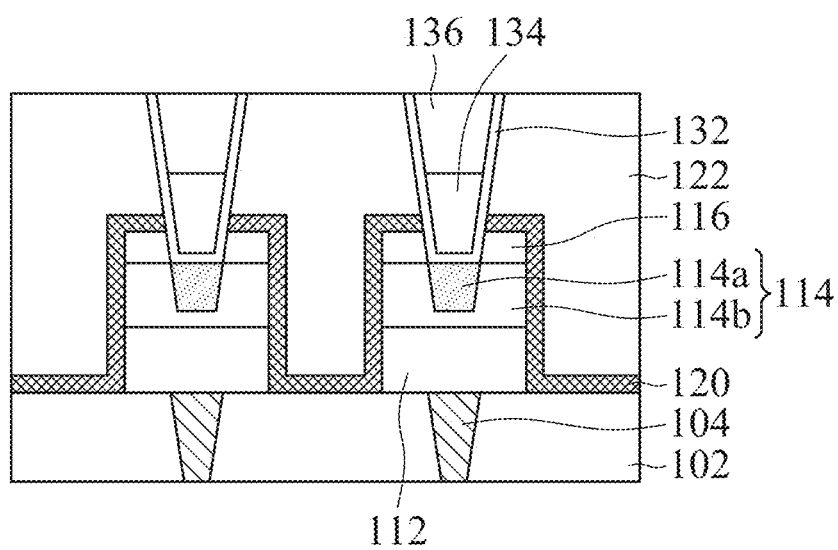
FIG. 3 shows a cross-sectional view of a RRAM structure in accordance with other embodiments of the present invention.

FIG. 3 shows a cross-sectional view of a RRAM structure 300 in accordance with other embodiments of the present invention. The RRAM structure 300 shown in FIG. 3 is similar to the RRAM structure 200 shown in FIG. 2D, and the difference is that the conductive liner 132 of FIG. 3 is in direct contact with the resistance switching layer 114. In order to simplify the description, the elements that are similar to those shown in FIG. 2D and the steps in the process of forming them will not be described in detail herein.

The RRAM structure 300 shown in FIG. 3 can be formed by a process procedure similar to that of FIGS. 2A-2D. In the present embodiment, when the etching process of FIG. 2C is performed, the etching depth can be controlled, such that the depth of the opening 225 is greater than or equal to the depth of the implantation control layer 116. In addition, the remaining steps are the same as those of FIGS. 2A-2D.

In the present embodiment, the resistance switching layer 114 is exposed by the opening 225. Therefore, the conductive liner 132 directly contacts the resistance switching layer 114. The conductivity of the conductive liner 132 is better than the conductivity of the implantation control layer 116. Therefore, by directly contacting the conductive liner 132 with the resistance switching layer 114, the operating voltage can be reduced and the performance of the RRAM can be further improved.

The steps of the process shown in FIGS. 1A-1D and those shown in FIGS. 2A-2D can produce the same RRAM structure (i.e., the RRAM structure 100 in FIG. 1D or the RRAM structure shown in FIG. 2D).

The steps of the process shown in FIGS. 1A-1D do not require the use of the patterned photoresist layer 218, thereby simplifying the process and reducing production cost and production time. Furthermore, the openings 125 in the interlayer dielectric layer 122 and the protective layer 120 can simultaneously define the position of the top electrode layer 134 and the position of the conductive filament confined region 114a. Therefore, the top electrode layer 134 can be formed directly above the conductive filament confined region 114a in a self-aligned manner, and the electric field can be accurately concentrated at the position of the conductive filament confined region 114a. As a result, the performance and yield of the RRAM can be greatly improved.

On the other hand, by adjusting the depth of the opening 225, the steps of the process shown in FIGS. 2A-2D can produce the RRAM structure 200 shown in FIG. 2D or the RRAM structure 300 shown in FIG. 3. Therefore, the flexibility of the process is high, and the performance of the RRAM can be further improved.

The RRAM structure provided in the embodiment of the present invention, the resistance switching layer includes a conductive filament confined region directly under the top electrode layer. As a result, the yield and reliability of the final product can be greatly improved. In the manufacturing method of the RRAM structure provided by the embodiment of the present invention, the etching process is not performed to the sidewall of the top electrode layer. Therefore, the undercut of the sidewall of the top electrode layer does not occur, and this can further improve the yield and reliability of the final product. Furthermore, the manufacturing method of the RRAM structure provided by the embodiment of the present invention can be adjusted as needed. Therefore, the flexibility of the process is high. In addition, the manufacturing method of the RRAM structure provided by the embodiment of the present invention can be easily integrated into an existing process. Therefore, the performance, yield and reliability of the final product can be greatly improved without affecting the complexity of the process, production cost, and production time.

Although the disclosure has been described by way of example and in terms of the preferred embodiments, it should be understood that various modifications and similar arrangements (as would be apparent to those skilled in the art) can be made herein without departing from the spirit and scope of the disclosure as defined by the appended claims.

What is claimed is:

1. A resistive random access memory structure, comprising:
   a bottom electrode layer located on a substrate;
   a resistance switching layer located on the bottom electrode layer, wherein the resistance switching layer comprises a conductive filament confined region and an outer region surrounding the conductive filament confined region;
   an implantation control layer located on the resistance switching layer;
   a protective layer conformally covering the bottom electrode layer, the resistance switching layer and the implantation control layer, wherein the protective layer has a first opening; and
   a top electrode layer located on the implantation control layer, wherein a position of the top electrode layer corresponds to a position of the conductive filament confined region, a portion of the top electrode layer is filled into the first opening, and a top surface of the top electrode layer is higher than a top surface of the protective layer.

2. The resistive random access memory structure as claimed in claim 1, wherein the resistance switching layer comprises a dopant, and the dopant comprises aluminum ions, zirconium ions, titanium ions, zinc ions, silver ions, manganese ions, molybdenum ions, tantalum ions, or a combination thereof.

3. The resistive random access memory structure as claimed in claim 2, wherein the dopant in the conductive filament confined region has a first concentration C1, the dopant in the outer region has a second concentration C2, and a ratio C1/C2 of the first concentration C1 to the second concentration C2 is 5-100.

4. The resistive random access memory structure as claimed in claim 1, wherein a material of the implantation control layer comprises silicon dioxide, silicon oxynitride, silicon nitride, titanium oxynitride, or a combination thereof.

5. The resistive random access memory structure as claimed in claim 4, wherein a material of the protective layer comprises aluminum oxide, aluminum nitride, silicon oxynitride, silicon nitride, titanium dioxide, tantalum dioxide, tantalum oxide, zirconium dioxide, or a combination thereof, and the material of the protective layer is different from the material of the implantation control layer.

6. The resistive random access memory structure as claimed in claim 1, wherein the implantation control layer has a thickness T2, the resistance switching layer has a thickness T1, and a ratio T2/T1 of the thickness T2 to the thickness T1 is 0.1-0.8.

7. The resistive random access memory structure as claimed in claim 1, further comprising:
   an interlayer dielectric layer formed on the protective layer, wherein the interlayer dielectric layer has a second opening connected to the first opening of the protective layer; and
   a contact plug formed on the top electrode layer, wherein a top surface of the contact plug is coplanar with a top surface of the interlayer dielectric layer.

8. The resistive random access memory structure as claimed in claim 1, wherein the implantation control layer is exposed by the first opening.

9. The resistive random access memory structure as claimed in claim 1, wherein the conductive filament confined region is exposed by the first opening.

10. A method for manufacturing a resistive random-access memory structure, comprising:
- forming a bottom electrode on a substrate;
- forming a resistance switching layer on the bottom electrode;
- forming an implantation control layer on the resistance switching layer;
- forming a protective layer conformally covering the bottom electrode layer, the resistance switching layer, and the implantation control layer, wherein the protective layer has a first opening;
- performing an ion implantation process to form a conductive filament confined region and an outer region in the resistance switching layer, wherein the outer region surrounds the conductive filament confined region; and
- after forming the protective layer, forming a top electrode layer on the implantation control layer, wherein a position of the top electrode layer corresponds to a position of the conductive filament confined region, a portion of the top electrode layer is filled into the first opening, and a top surface of the top electrode layer is higher than a top surface of the protective layer.

11. The method for manufacturing the resistive random access memory structure as claimed in claim 10, further comprising:
- forming an interlayer dielectric layer on the protective layer;
- forming a second opening in the interlayer dielectric layer, wherein the second opening and the first opening of the protective layer are connected; and filling a conductive material into the first opening and the second opening to form the top electrode layer.

12. The method for manufacturing the resistive random access memory structure as claimed in claim 11, wherein forming the conductive filament confined region and the outer region comprises:
- forming a patterned photoresist layer on the implantation control layer, wherein the patterned photoresist layer has a third opening, and the implantation control layer is exposed by the third opening; and
- performing the ion implantation process to form the conductive filament confined region and the outer region in the resistance switching layer, wherein the position of the conductive filament confined region corresponds to a position of the third opening, wherein forming the interlayer dielectric layer on the protective layer is after forming the conductive filament confined region and the outer region.

13. The method for manufacturing the resistive random access memory structure as claimed in claim 12, wherein the implantation control layer or the resistance switching layer is exposed by the second opening, and a position of the second opening corresponds to the position of the conductive filament confined region.

14. The method for manufacturing the resistive random access memory structure as claimed in claim 11, further comprising:
- forming a contact plug on the top electrode layer, wherein a top surface of the contact plug is coplanar with a top surface of the interlayer dielectric layer.

15. The method for manufacturing the resistive random access memory structure as claimed in claim 11, wherein performing the ion implantation process to form the conductive filament confined region and the outer region in the resistance switching layer is after forming the second opening in the interlayer dielectric layer, such that the position of the conductive filament confined region corresponds to a position of the first opening.

16. The method for manufacturing the resistive random access memory structure as claimed in claim 15, wherein the implantation control layer is exposed by the first opening.

17. The method for manufacturing the resistive random access memory structure as claimed in claim 11, wherein the conductive filament confined region is exposed by the first opening.

18. The method for manufacturing the resistive random access memory structure as claimed in claim 10, wherein the ion implantation process is performed to implant a dopant into the resistance switching layer, and the dopant comprises aluminum ions, zirconium ions, titanium ions, zinc ions, silver ions, manganese ions, molybdenum ions, tantalum ions, or a combination thereof.

19. The method for manufacturing the resistive random access memory structure as claimed in claim 18, wherein an implantation energy of the ion implantation process is 0.05-20 keV, and an implantation dose of the dopant is $10^{11}$-$10^{15}$ ion/cm$^2$.

20. The method for manufacturing the resistive random access memory structure as claimed in claim 18, further comprising:
- after performing the ion implantation process, performing an annealing process; and
- after performing the annealing process, the dopant in the conductive filament confined region has a first concentration C1, the dopant in the outer region has a second concentration C2, and a ratio C1/C2 of the first concentration C1 to the second concentration C2 is 5-100.

* * * * *